United States Patent [19]

Kojima et al.

[11] Patent Number: 4,542,088

[45] Date of Patent: Sep. 17, 1985

[54] PHOTOPOLYMERIZABLE COMPOSITIONS AND IMAGE-FORMING MATERIALS USING SAID COMPOSITIONS

[75] Inventors: Yasuo Kojima; Nobumasa Sasa, both of Hino, Japan

[73] Assignee: Konishiroku Photo Industry Co., Ltd., Tokyo, Japan

[21] Appl. No.: 474,023

[22] Filed: Mar. 10, 1983

[30] Foreign Application Priority Data

Mar. 18, 1982 [JP] Japan .................................. 57-41689
Mar. 18, 1982 [JP] Japan .................................. 57-41690

[51] Int. Cl.$^4$ ........................ G03C 1/68; G03C 1/70; G03C 1/84

[52] U.S. Cl. .................................. 430/273; 430/280; 430/281; 430/288; 430/521; 430/523; 430/905; 430/907; 430/910; 204/159.15

[58] Field of Search ............... 430/281, 271, 905, 907, 430/910, 915, 919, 523, 531, 288; 204/159.16, 159.15, 280, 273

[56] References Cited

U.S. PATENT DOCUMENTS

| | | | |
|---|---|---|---|
| 2,887,376 | 5/1959 | Tupis | 430/915 X |
| 4,284,707 | 8/1981 | Nagasawa et al. | 430/907 X |
| 4,293,635 | 10/1981 | Flint et al. | 430/910 X |
| 4,316,951 | 2/1982 | Cohen et al. | 430/271 X |
| 4,374,924 | 2/1983 | Yokoyama et al. | 430/528 |
| 4,405,394 | 9/1983 | Cohen | 430/273 X |

FOREIGN PATENT DOCUMENTS

| | | | |
|---|---|---|---|
| 027462 | 5/1975 | Japan . | |
| 158957 | 7/1979 | Japan . | |
| 119332 | 4/1983 | Japan . | |
| 58-61156 | 4/1983 | Japan | 204/159.15 |
| 2119810 | 11/1983 | United Kingdom | 204/159.15 |

OTHER PUBLICATIONS

Derwent Publications–42000w/25–English Abstract of Japanese Publication 027462 (05/26/75).
Derwent Publications–63914b/35–English Abstract of Japanese Publication 158957 (07/20/79).
Derwent Publications–35699k/15–English Abstract of Japanese Publication 119332 (03/04/83).

*Primary Examiner*—John E. Kittle
*Assistant Examiner*—Cynthia Hamilton
*Attorney, Agent, or Firm*—Frishauf, Holtz, Goodman & Woodward

[57] ABSTRACT

There are disclosed a photopolymerizable composition comprising an organic solvent-soluble ethylenic unsaturated compound, an organic solvent-dispersible, water-insoluble granular dispersion and an organic solvent-soluble photopolymerization initiator having mutually dissolved or dispersed in a solvent composed mainly of an organic solvent, and an image-forming material using the composition.

According to this invention, there are provided a photopolymerizable composition which is developable with water in a short period of time, has high film strength and water resistance of a photosensitive layer, high lipophilic properties and superior film-forming capability and can produce a highly sensitive resist as well as an image-forming material using said composition.

16 Claims, No Drawings

PHOTOPOLYMERIZABLE COMPOSITIONS AND IMAGE-FORMING MATERIALS USING SAID COMPOSITIONS

This invention relates to a photopolymerizable composition and an image-forming material using the same.

More particularly, it is concerned with a photopolymerizable composition, which is suitable for use as lithographic printing plate, resin letterpress printing plate, reproduction film or resist for printing base plate and shows a high sensitivity, an excellent developability and is developable with water, as well as an image-forming material using the same.

Heretofore, there have been proposed various photopolymerizable compositions which are employable as a photoresist and developable with water.

Japanese Patent Publications No. 42450/1971 and No. 14162/1975 disclose a photopolymerizable composition which comprises a water-soluble photopolymerization initiator and a water-soluble ethylene unsaturated compound having uniformly dissolved in a water-soluble polymer. However, such water-soluble photopolymerization initiators or ethylenic unsaturated compounds show generally a lower sensitivity, as compared with the organic solvent-soluble compounds, and a high photo-setting should be effected to impart sufficient film strength and water resistance thereto even when moistened owing to the water-soluble polymer applied. Moreover, insufficient lipophilicity is seen as an ink-receiving image for a lithographic printing plate.

Japanese Laid-Open Patent Application No. 91585/1979 suggests a photopolymerizable composition comprising a water-dispersible latex, a water-dispersible oligomer and a photopolymerization initiator. This composition can provide improved film strength and water resistance upon use of the latex, but shows an insufficient lipophilic nature. When water-soluble photopolymerization initiator and unsaturated compound are applied, the aforesaid disadvantages could not be avoided. Further, when organic solvent-soluble photopolymerization initiator and ethylenic unsaturated compound are dispersed in water with the aid of a surfactant and the like, there results poor compatibility with the latex to form a sticky surface, together with an unsatisfactory sensitivity.

Under these circumstances, the present inventors have before proposed an image-forming material which is developable with water and has a high sensitivity and a strong film strength, said material comprising a water-softening high molecular compound, an ethylenic unsaturated compound and a photopolymerization initiator, as disclosed and claimed in our co-pending Japanese Patent Application No. 119332/1981. As a result of our continued studies on this image-forming material, it has been found that said material has a disadvantage of requiring a prolonged period for development.

As a further result of our earnest studies upon the aforesaid fact, it has now been found that a resist derived from a photopolymerizable composition is capable of being developed with water in a short period of time, said composition comprising an organic solvent-soluble ethylenic unsaturated compound, an organic solvent-dispersible, water-insoluble granular dispersion and an organic solvent-soluble photopolymerization initiator and the present invention has then been completed upon the above finding.

It is accordingly a primary object of this invention to provide a photopolymerizable composition which is developable with water in a short period of time, has high film strength and water resistance of a photosensitive layer, high lipophilic properties and superior film-forming capability and can produce a highly sensitive resist as well as an image-forming forming material using said composition.

The present object as above can be accomplished by a photopolymerizable composition which comprises an organic solvent-soluble ethylenic unsaturated compound, an organic solvent-dispersible, water-insoluble granular dispersion and an organic solvent-soluble photopolymerization initiator having each being dissolved or dispersed in a solvent composed mainly of an organic solvent and also by an image-forming material which comprises (a) a colored masking layer over a support and (b) a coated layer with a photosensitive composition containing said photopolymerizable composition over said layer (a).

A preferred embodiment according to this invention is a photopolymerizable composition wherein said water-insoluble granular dispersion is a latex state high molecular compound, having a polar group, said polar group being a polar group having a quaternary nitrogen atom or a quaternary phosphorus atom, and said ethylenic unsaturated compound is present in an amount of from 40 to 70% by weight based on the total weight of the solid content.

Another preferred embodiment according to this invention is an image-forming material wherein said layer (b) is a coated layer with a photosensitive composition, in which said water-insoluble granular dispersion is a latex high molecular compound, said water-insoluble granular dispersion is dispersible in an organic solvent and said ethylenic unsaturated compound and photopolymerization initiator are soluble in an organic solvent; and said colored masking layer contains a water-softening high molecular compound and carbon black as a coloring agent.

The present photopolymerizable composition contains very little hydrophilic or water-soluble components as depicted above. Nevertheless, the present composition is capable of being developed with water and thus can show very high lipophilic properties and water resistance. It can be safely said that such properties or effects should be quite surprising, regarded from the point of view of the prior art photopolymerizable compositions.

This invention will be illustrated in greater detail hereinbelow.

First, the organic solvent-dispersible, water-insoluble granular dispersion will be more fully illustrated below.

The organic solvent-dispersible, water-insoluble granular dispersion (hereinafter referred to as granular dispersion) is meant to indicate a dispersion which is kept under a stable condition over several hours or longer in the desired organic solvent without occurence of dissolution, aggregation and precipitation.

The granular dispersion which is useful in this invention is not critical in the type thereof unless dissolution, aggregation or precipitation occurs. Also, this dispersion may be applied either alone or in combination with two or more thereof.

Examples of such granular dispersions include latex high polymer compounds such as a polyacrylic acid ester or its copolymer, a polyacrylonitrile or its copolymer, a polystyrene or its copolymer, a polyethylene or its copolymer, a polyvinylidene chloride or its copolymer, a polyvinyl acetate or its copolymer, a resol resin or its copolymer, an ionomer resin, a polymethyl methacrylate or its copolymer, a polybutadiene or its copolymer and the like.

Also, it is preferable that said latex high polymer compound is a copolymer with a monomer having polar groups in its main or side chain.

Preferred examples of said polar group may include

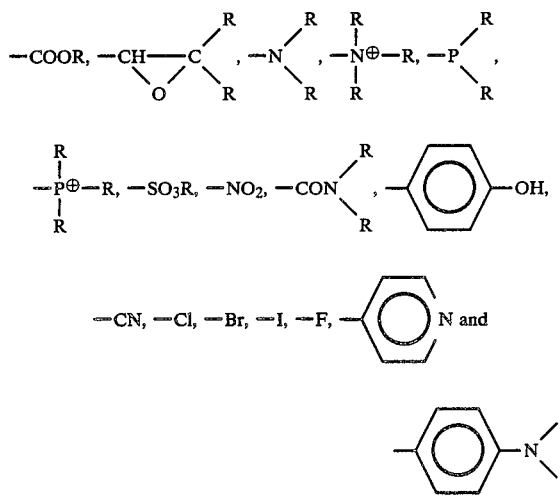

(wherein R is a hydrogen atom, an alkyl group or a carbocyclic group).

Particularly preferred are those copolymers with the monomers having a quaternary nitrogen atom or quaternary phosphorus atom. Of these copolymers, representative examples of those containing the quaternary nitrogen atom in the main chain are those containing the so-called ionen type monomer unit represented by the general formula (I)

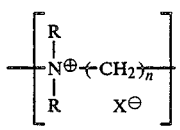

wherein $X^{\ominus}$: an anion, R: an alkyl group or a carbocyclic group, and n: an integer.

Representative examples of those containing the quaternary nitrogen atom in the side chain are those containing the methacryloxyalkylammonium monomer unit represented by the general formula (II)

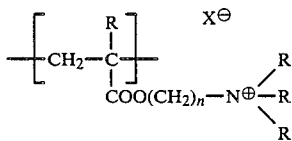

wherein $X^{\ominus}$: an anion, R: an alkyl group or a carbocyclic group, and n: an integer; the vinylbenzylammonium monomer unit represented by the general formula (III)

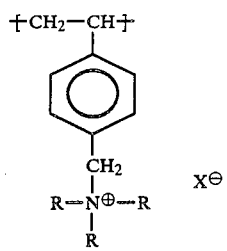

wherein $X^{\ominus}$: an anion and R: an alkyl group or a carbocyclic group; and the unit of said benzylammonium monomer unit bound via an amide group represented by the general formula (IV), as disclosed in Japanese Laid-Open Patent Application No. 22766/1980,

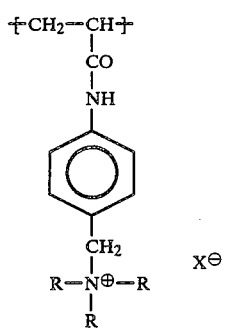

wherein $X^{\ominus}$: an anion and R: an alkyl group or a carbocyclic group.

On the other hand, examples of the monomer unit containing the quaternary phosphorus atom in the main chain are those represented by the general formula (V)

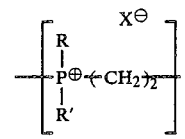

wherein $X^{\ominus}$: an anion and R, R': an alkyl group or a carbocyclic group, while examples of the monomer unit containing said atom in the side chain are those represented by the general formula (VI)

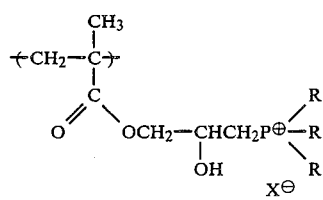

wherein $X^{\ominus}$: an anion and R: an alkyl group or a carbocyclic group.

In the above general formulae (I) to (VI), illustrative examples of the anion represented by $X^{\ominus}$ may include, for instance, a halide ion, a sulfate ion, a phosphate ion, a sulfonate ion, an acetate ion and the like. Examples of the alkyl group represented by R or R' may include, for instance, methyl, ethyl, propyl, isobutyl, pentyl, hexyl, heptyl, decyl and the like. As the carbocyclic group, there may be mentioned, for instance, an aryl, aralkyl or cycloalkyl group such as benzyl, phenyl, p-methylbenzyl, cyclohexyl, cyclopentyl and the like. In the above formulae, the alkyl or carbocyclic groups represented by R and attached to $N^\oplus$ or $P^\oplus$ may be the same or different.

Such latex high polymer compounds may be prepared by emulsion polymerization. Alternatively, such compounds may be prepared by converting the previously synthesized polymer to latex. In order that an organic solvent-soluble ethylenic unsaturated compound or a photopolymerization initiator may be used, said latex is preferably dispersed in an organic solvent. Moreover, said latex is preferably internally cross-linked among granules in order to increase stability to an organic solvent.

More specifically, in a preferred embodiment that the granular dispersion is a latex of a polyacrylic acid ester or its copolymer, a polystyrene or its copolymer, a polyethylene or its copolymer, a polyvinyl chloride or its copolymer, a polyvinylidene chloride or its copolymer or a polyvinyl acetate or its copolymer. Preferably, said latex is a copolymer with a monomer having the polar group of the following general formula:

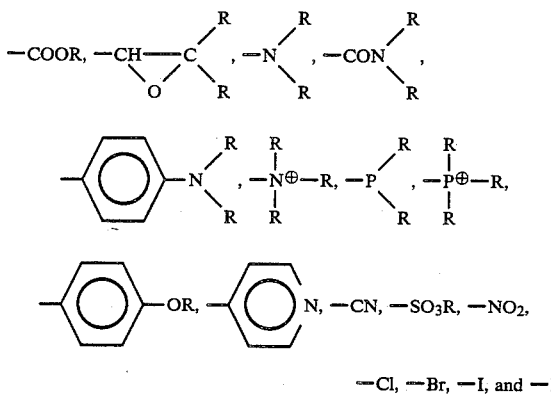

(wherein R is a hydrogen atom, an alkyl group or a carbocyclic group) and, more preferably, said latex contains the quaternary nitrogen or phosphorus atom in the main or side chain and, more preferably, is interally cross-linked among granules and, particularly preferably, an organic solvent is used herein as a dispersion medium.

As the present granular dispersion, there may be, in addition, employed an inorganic filler dispersion or a low molecular emulsion. As a preferred inorganic filler dispersion, there may be mentioned such substantially transparent granules as colloidal silica or colloidal alumina. Also, as a preferred low molecular emulsion, there may be mentioned such high water-repellent emulsion as wax emulsion and the like. It is also preferable in these inorganic filler dispersions or low molecular emulsions that an organic solvent is employed as a dispersion medium.

A particle diameter of the granular dispersion which may be employed in this invention is preferably in the range of 10 mμ to 1μ. If a particle diameter is larger than 1μ, an eventually formed image has a poor resolving power, while granules having a particle diameter of less than 10 mμ are practically difficult to prepare.

The present ethylenic unsaturated compounds may include a monomer, a prepolymer, i.e. a dimer, a trimer, a tetramer and an oligomer (a polymerized compound or a polycondensated compound having a molecular weight of not more than 10,000), a mixture thereof, a copolymer thereof and the like.

As the ethylenic unsaturated compound which may be employed in this invention, there may be, for instance, mentioned acrylic and methacrylic acid esters of polyhydric alcohols, examples of which are acrylic and methacrylic acid esters of ethylene glycol, triethylene glycol, tetraethylene glycol, propylene glycol, trimethylolpropane, pentaerythritol, neopentyl glycol and the like.

Also, there may be employed acrylic and methacrylic acid esters modified and derived from bisphenol A, e.g. a reaction product of bisphenol A-epichlorohydrin epoxy resin prepolymer with acrylic or methacrylic acid; acrylic and methacrylic acid esters of bisphenol A-alkylene oxide addition product or its hydrogenated product; and the like.

Apart from such esters, there may be also usefully employed methylene bisacrylamide, methylene bismethacrylamide and bisacryl or bismethacrylamides of diamine such as ethylenediamine, propylenediamine, butylenediamine, pentamethylenediamine and the like.

Also a reaction product of a diol monoacrylate or methacrylate with diisocyanate, triacrylformal or triallyl cyanurate is suitable.

Apart from such monomeric compounds, there may be also employed a linear high polymeric compound containing an acryloxyloxy group or a methacryloyloxy group in the side chain, e.g. an open ring copolymer of glycidyl methacrylate, acrylic or methacrylic acid addition reaction products of a vinyl copolymer with glycidyl methacrylate and the like.

As the present ethylenic unsaturated compound, there may be employed the water-soluble compound if soluble in an organic solvent, but the water-insoluble compound is preferable in view of photosensitivity and water resistance of image. Particularly, pentaerythritol tetraacrylate and trimethylolpropane triacylate are employable as a preferred monomer in view of photosensitivity.

As the photopolymerization initiator which may be employed for this invention, there are mentioned those generally known to be effective in combination with the ethylenic unsaturated compound and soluble in an organic solvent, which may include the following non-limiting compounds:

Illustrative examples thereof are acyloin; acryloin derivatives such as benzoin methyl ether, benzoin ethyl ether, benzoin butyl ether and the like; decyl bromide, decyl chloride, decylamine and the like; ketones such as benzophenone, acetophenone, benzyl and benzoyl cyclobutanone and the like; substituted benzophenones such as Michler's ketone, diethoxyacetophenone, halogenated acetone, benzophenone and the like; thioxanthone derivatives such as thioxanthone, chlorothioxanthone, isopropylthioxanthone, diisopropylthioxanthone, methylthioxanthone and the like; quinone and benzoquione, polynuclear cyclic quinones such as anthraquinone and phenanthrenequinone; substituted polynuclear cyclic quinones such as chloroanthraquinone, methylanthraquinone, octamethylanthraquinone, naphthoquinone, dichloronaphthoquinone and the like; halogenated aliphatic, alicyclic and aromatic hydrocarbons and mixtures thereof (said halogen being Cl, Br, F, I) such as mono- and polychlorobenzenes, mono- and polybromobenzenes, mono- and polychloroxylenes, mono- and polybromoxylenes, dichloromaleic anhydride, 1-(chloro-2-methyl)naphthalene, 2,4-dimethylbenzene morphonyl chloride, 1-bromo-3-(m-phenoxyphenoxy)benzene, 2-bromoethyl methyl ether, chlorendic anhydride and its esters, chloromethylnaphthyl chloride, chloromethylnaphthalene, bromomethylphenanthrene, diiodomethylanthracene, hexachlorocyclopentadiene, hexachlorobenzene, octachlorocyclopentene and their compounds, lophine dimer and heterocyclic compounds represented by N-methyl-2-benzoylmethylene-β-naphthothiazole, N-ethyl-2-(2-thenoyl)methylene-β-naphthothiazole and the like. In this invention, there may be employed organic solvent-soluble, water-soluble photopolymerization initiators, but those initiators, which are soluble in an organic solvent and insoluble in water, are preferably employed.

In the present photopolymerizable composition, there may be, if necessary, employed the following amine compounds as a sensitizing aid for increasing sensitivity. Namely, diethylamine, triethylamine, isopropylamine, diisopropylamine, n-butylamine, n-dibutylamine, n-tributylamine, isobutylamine, sec-butylamine, n-amylamine, sec-amylamine, tert-hexylamine, 2-ethylbutylamine, ethylenediamine, propylenediamine, diethylenetriamine, aniline, monomethylaniline, diethylaniline, o-toluidine, o-chloroaniline, cyclohexylamine, monoethanolamine, diethanolamine, triethanolamine, ethylmonoethanolamine, n-butylmonoethanolamine, dimethylethanolamine, diethylethanolamine, ethyldiethanolamine, n-butyldiethanolamine, di-n-butylethanolamine, triisopropanolamine, N,N-dimethylaniline sulfate, N,N'-diethylaniline sulfate, dialkylaminobenzoic acids or their esters and the like.

It is preferable that a heat polymerization inhibitor is further incorporated into the present photopolymerizable composition. As the heat polymerization inhibitor, there may be mentioned, for example, p-methoxyphenol, hydroquinone, alkyl or aryl substituted hydroquinones, t-butylcathecol, pyrogallol, cuprous chloride, phenothiazine, chloranil, naphthylamine, β-naphthol, 2,6-ditert-butyl-p-cresol, pyridine, nitrobenzene, dinitrobenzene, p-toluidine, methylene blue, copper salts of organic acids (e.g. copper acetate) and the like.

The present photopolymerizable composition may further include such additives as a coloring agent, a plasticizer and the like. As the coloring agent, there may be mentioned, for example, pigments such as titanium oxide, iron oxide, phthalocyanine pigments, azo pigments and the like; dyes such as Methylene Blue, Crystal Violet, Rhodamine B, Fuchsine, Auramine, azo dyes, anthraquinone dyes and the like; and the like. As the plasticizer, there may be mentioned, for example, phthalic acid esters such as dimethyl phthalate, diethyl phthalate, dibutyl phthalate, diisobutyl phthalate, diheptyl phthalate, dioctyl phthalate, octyl capryl phthalate, dicyclohexyl phthalate, ditridecyl phthalate, butyl benzyl phthalate, diisodecyl phthalate, diaryl phthalate and the like; glycol esters such as dimethylglycol phthalate, ethylphthalylethyl glycolate, methylphthalylethyl glycolate, butylphthalylbutyl glycolate, triethyleneglycol dicaprylic acid ester, triethyleneglycol dicaprylic acid ester and the like; phosphoric acid esters such as tricresyl phosphate, triphenyl phosphate and the like; dibasic aliphatic acid esters such as diisobutyl adipate, dioctyl adipate, dimethyl sebacate, dibutyl sebacate, dihexyl azelate, dioctyl azelate, dibutyl maleate and the like; triethyl citrate, tributyl citrate, glycerol triacetyl ester, butyl laurate, 4,5-diepoxycyclohexane-1,2-dicarboxylic acid, di-2-ethylhexyl and the like.

An amount of the ethylene unsaturated compound to be added into a photopolymerizable composition containing the present granular dispersion is 20 to 90% by weight, preferably 40 to 70% by weight, in a total solid content of said photopolymerizable composition. An amount of the photopolymerization initiator to be added is in the range of about 1 to 100% by weight, preferably 10 to 50% by weight, to the ethylenic unsaturated compound. Further, an amount of the amine compound, which may be added as a sensitizing aid if required, is about 1 to 500% by weight, preferably 10 to 200% by weight, to the photopolymerization initiator. Also, an amount of the heat polymerization inhibitor optionally added is preferably 0.001 to 5% by weight to the photopolymerizable composition.

Then, the image-forming material according to this invention will be more fully illustrated below.

The present image-forming material comprises the above-mentioned photopolymerizable composition coated over a support directly or further comprises a colored masking layer between the support and the coated composition.

A film thickness of the photosensitive layer formed by coating the present photopolymerizable composition over a suitable support is 0.1 to 7 μm, preferably 0.5 to 5 μm.

The colored masking layer to be coated in the present image-forming material can act as a layer wherein a colored image is formed in the region of the photosensitive layer dissolved away with a solvent by dissolving away with the same or different solvent or by rubbing removal. Said colored image-forming layer is composed of a dye or pigment as a coloring agent dispersed, admixed or dissolved in a binder. The dye may be properly selected and used from ultraviolet absorbers and other dyes such as those disclosed in Japanese Laid-Open Patent Application No. 16124/1972 and the like, while the pigment may be selected from organic and inorganic pigments such as those disclosed in "Handbook of Pigments" (in Japanese) edited by Japanese Pigment Technology Association and Japanese Laid-Open Patent Application No. 16124/1972 and the like.

Where the present image-forming material is employed as a lithographic press original copy, carbon black is preferably employed as a coloring agent, because the carbon black has a high covering power so that a film thickness may be made thin for the same level of density and a good image reproductivity may be attained.

As the binder for the present colored masking layer, there may be employed a wide variety of high molecular binders, but a water-soluble or water-softening high molecular compound is preferable. As the water-soluble high molecular compound, there may be mentioned, for example, a natural high molecular compound such as casein, albutin, gelatin, gum arabic and the like; a water-soluble cellulose ether such as methyl cellulose, carboxymethyl cellulose, hydroxyethyl cellulose, hydroxypropylmethyl cellulose and the like; a synthetic water-soluble high molecular compound such as polyacrylic acid, polymethacrylic acid, polyacrylamide, polyvinyl pyrrolidone, poly sodium L-glutamate, a water-soluble polyvinyl butyral, polyvinyl alcohol, a copolymer of vinyl alcohol with maleic acid, a copolymer of vinyl alcohol with acrylamide, a copolymer of vinyl pyrrolidone with vinyl acetate, a copolymer of a (metha)acrylic acid ester with (metha)acrylic acid, acylated gelatin, e.g. phthalic gelatin or maleic gelatin, and the like. This compound may be employed either alone or in combination with two or more thereof.

As the binder for the present colored masking layer, there may be preferably employed a water-softening high molecular compound. The water-softening high molecular compound as used herein is meant to indicate a compound, the Young's modulus of which is decreased in the presence of water. The high molecular compounds having a moisture rate of 1.5 to 30% at a relative humidity of 80% (25° C.) are preferred. As preferred water-softening high molecular compounds, there may be mentioned, for example, methyl cellulose, ethyl cellulose, butyl cellulose, hydroxyethyl cellulose, carboxymethyl cellulose, cyanoethyl cellulose, cellulose acetate, cellulose triacetate, cellulose acetate butyrate, cellulose acetate phthalate, hydroxypropylmethyl cellulose phthalate, hydroxypropylmethyl cellulose hexahydrophthalate, polyacrylic acid ester, polymethacrylic acid ester, polyvinyl butyral, polymethyl vinyl ketone, nylon 66, polyamide, polyvinyl methoxyacetal, polyvinyl acetate, epoxy resin, polyurethane and the like. In addition, there may be employed an addition polymer having a carboxyl group in the side chain, for example, a methacrylic acid copolymer, an acrylic acid copolymer, an itaconic acid copolymer, a partially esterified maleic acid copolymer, a maleic acid copolymer, a crotonic acid copolymer and the like.

Addition polymers having a hydroxy group, a carbamoyl group or a dimethylamino group in the side chain may be similarly applied and examples thereof may include a vinyl alcohol copolymer, a vinyl aryl alcohol copolymer, a methylene diethylmalonate copolymer (a reduced product), a maleic anhydride copolymer (a reduced product), an acrylamide copolymer, a methacrylamide copolymer, an N,N'-dimethylaminomethyl methacrylate copolymer, an N,N'-dimethylaminoethyl acrylate copolymer, an N,N'-dimethylaminoethyl methacrylate copolymer and the like. Further, a vinylpyrrolidone copolymer is also useful.

Molar ratios of the carboxyl group, the hydroxy group, the carbamoyl group or the dimethylamino group in the aforesaid copolymer may vary depending upon the sort of other copolymer components and determined within the above-defined range with respect to water-softening. Such high molecular compounds may be applied either alone or in combination with the two or more.

A ratio of the coloring agent to the binder in the masking layer for this invention may be determined according to any well-known methods to those skilled in the art, taking into account the desired optical density and removal rate of the masking layer to water. In particular, if the water-softening high molecular compound is used as the binder, the pigment as the coloring agent and water as a developing solution, it is desirable that a ratio of the coloring agent/the binder is 1.0/not less than 2.0.

The present image-forming material may also include a metallized layer. As the metal employable for said metallization, there may be mentioned, for example, a metal composed mainly of aluminium as disclosed in Japanese Laid-Open Patent Application No. 139720/1975; tellurium, molybdenum, polonium, cobalt, zinc, copper, nickel, iron, tin, vanadium, germanium, silver, chromium, titanium or an alloy thereof as disclosed in Japanese Laid-Open Patent Applications No. 65927/1973, No. 65928/1973, No. 2925/1975 and No. 14161/1975.

The metallization (or metallizing) as used herein includes vacuum metallizing by a conventional resistance heating method as well as electron-beam heat metallizing, spattering or ion plating methods.

As the support which the present photopolymerizable composition is to be coated over, there may be preferably employed any dimensionally stable plate materials. Such support may include, for example, a paper; a paper laminated with plastics, e.g. polyethylene, polypropylene, polystyrene; a metal plate such as aluminium, zinc, copper; a plastic film such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal and the like. Of these supports, there can be preferably employed polyethylene terephthalate, a paper laminated with polyethylene or aluminium plate.

A support may be subjected to surface treatment, if required. For instance, an aluminium plate is preferably surface-treated by any one or combination of the two or more of sandblast treatment, immersion treatment in an aqueous solution of sodium silicate, potassium salt of fluorozirconium acid or phosphoric acid salt or anodizing treatment.

In the case of a plastic surface support, surface treatment may be preferably made by any one or combination of the two or more of chemical treatment, discharge tretment, flame treatment, ultraviolet ray treatment, high-frequency glow discharge treatment, active plasma treatment and the like.

Moreover, a support may include a subbing layer for improved adhesive properties. Suitable synthetic resin for the subbing layer may include an acrylic acid ester resin, a vinylidene chloride resin, a vinylidene chloride-acrylonitrile-itaconic acid copolymer resin, a vinylchloride-vinyl acetate-maleic anhydride copolymer resin, an acrylamide or methacrylamide derivative-alkyl acrylate or methacrylate, aliphatic acid vinyl ester, styrene or acrylonitrile copolymer resin, a copolyester resin of phthalic or isophthalic acid with glycols, a polymer or copolymer of glycidyl acrylate or methacrylate and the like. Also, gelatin is useful as a subbing layer component. Apart from the aforesaid resins, other synthetic resins are known as a component for the subbing layer. Preparation and application procedures for coating liquid are well-known technique in the photographic material manufacture field of the instant invention and may be properly applied. Generally, the synthetic resin as above is made into a solution or latex in water or an organic solvent and then coated over a support according to a coating method such as extruder coating, roller coating, air-knife coating, spray coating and the like.

In order to prevent the photosensitive layer prepared by coating with the present photopolymerizable composition from polymerization inhibition caused by oxygen action and surface damage and improve vacuum adhesive properties, an overcoating layer, which is able to dissolve or swell in development, may be formed onto the photosensitive layer prepared by coating the present photopolymerizable composition over a suitable support or base. This overcoating layer may be mechanically matted or a resin layer containing a matting agent. As the matting agent, there may be mentioned silicon dioxide, zinc oxide, titanium oxide, zirconium oxide, glass particles, alumina, starch, polymer grains (e.g. grains of polymethyl methacrylate, polystyrene, phenol resin) and matting agents as disclosed in U.S. Pat. Nos. 2,701,245 and 2,992,101. They may be applied in combination with the two or more thereof. The resin to be used for the overcoating layer with a matting agent may be properly selected and applied. Illustrative examples thereof may include gum arabic, glue, gelatin, casein, cellulose (e.g. viscose, methyl cellulose, ethyl cellulose, hydroxyethyl cellulose, hydroxypropylmethyl cellulose, carboxy methyl cellulose and so on), starch (e.g. soluble starch, denaturated starch and so on), polyvinyl alcohol, polyethylene oxide, polyacrylic acd, polyacrylamide, polyvinyl methyl ether, polyvinyl pyrrolidone, polyamide and the like. These resins may be applied in combination with the two or more thereof.

Next, application of the present photopolymerizable composition will be more fully illustrated below.

The present photopolymerizable composition may be prepared by diluting the granular dispersion in water or various organic solvents as a dispersion medium with the desired organic solvent to a proper viscosity and admixing with the ethylenic unsaturated compound, the photopolymerization initiator and others to form a uniform coating solution. Preferred organic solvents include acetone, methanol, ethanol, isobutyl alcohol, n-butyl alcohol, isopropyl alcohol, n-propyl alcohol, methyl ethyl ketone, methyl isobutyl ketone, cyclohexanone, β-hydroxyethylmethyl ether, methyl cellosolve acetate, dimethylformamide, hexamethyl phosphonamide, tetrahydrofuran, chlorobenzene, methylene chloride, chloroform, triethylene glycol, trichlene and the like.

In this instance, it is desirable to use an organic solvent as the dispersion medium for the granular dispersion. However, it would be enough that a water content when made up a coating solution is so small as not adversely affecting its efficiency. The water content is less than 50%, preferably less than 10%. At a more increased water content, compatibility would become poor and a reduced sensitivity could be produced with influence to image quality.

The coating solution thus prepared may be coated over a support by any of conventional methods such as well-known whirler coating, dip coating, roller coating, spray coating, air-knife coating or doctor-knife coating.

As regards effects by the present invention, the image-forming process using the photosensitive layer from the present photopolymerizable composition comprises image exposure of the so produced photosensitive layer to active ray. As light source, there may be utilized, for example, a variety of light sources such as ultra-high pressure mercury arc lamp, tungsten lamp, mercury-arc lamp, xenon lamp, CTR light source, laser beam source and so on.

In the photosensitive layer image-exposed to active ray, e.g. ultraviolet ray, cross-linking reaction can proceed with photopolymerization so as to become insolubilized to water.

When the exposed photosensitive layer is dipped into water and water-developed, an unexposed portion of image can be easily developed by light rubbing, because the irradiation surface thereof is adhered and reinforced. At this time, the unexposed image portion is removed to form a positive-negative image.

This invention will be illustrated by way of the following examples, but they are not to be construed as limiting the scope of this invention thereto.

EXAMPLE 1

An aluminium sheet with a thickness of 0.30 mm was degreased by dipping it in a 20% aqueous solution of sodium phosphate, electropolished in sulfuric acid, treated with an aqueous solution of sodium metasilicate, washed with water and then dried. Thereafter, the photopolymerizable composition coating liquid was coated onto the treated aluminium sheet to a thickness of 2μ after drying.

A 10% dispersion of Methyl Cellosolve of

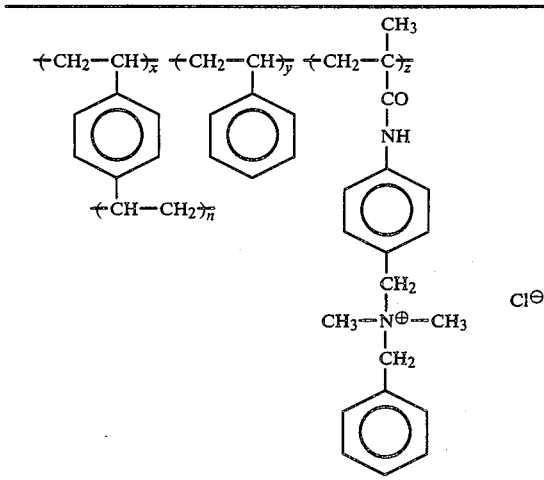

| | |
|---|---|
| (wherein x:y:z = 4:48:48) | 100 parts by weight |
| Trimethylolpropane triacrylate | 10 parts by weight |
| Diisopropyl thioxanthone | 2 parts by weight |
| Dimethylaminobenzoic acid isoamyl ester | 1 part by weight |
| Hydroquinone | 0.01 part by weight |
| Methyl Cellosolve | 100 parts by weight |

Onto the above-mentioned photosensitive plate sample were adhered a negative film and Sakura step tablet TPS-A for sensitivity determination and then exposed to a 1.5 KW metal halide lamp for 5 seconds from a distance of 80 cm. The sample was dipped into water at 20° C. for 10 seconds, lightly rubbed with a sponge to remove an uncured portion, thereby producing a printing plate sample.

The photosensitive layer in the above-mentioned sample was cured up to 5 steps of the Sakura step table TPS-A and the printing plate sample was applied to a sheet-fed offset press for printing onto a fine quality paper to produce more than 20,000 good printed sheets.

COMPARATIVE EXAMPLE 1

A photosensitive plate sample was prepared according to the same procedures as in Example 1 except that there was employed the following formulation as a photopolymerizable composition coating liquid.

| | |
|---|---|
| An aqueous emulsion of an ethylene-vinyl acetate copolymer (a solid content of 48%) | 20 parts by weight |
| Polyethylene glycol diacrylic acid ester | 10 parts by weight |
| Sodium anthraquinone-β-sulfonate | 2 parts by weight |
| Water | 100 parts by weight |

This sample was exposed and developed in the same manner as in Example 1, whereby an image portion was dissolved out to produce no image. Then, exposure was applied for 50 seconds to produce an image cured up to 3 steps of the step tablet.

Thereafter, this printing plate was applied to printing in the same manner as in Example 1 to produce no good printed sheets having a printing ink adhered onto an image portion insufficiently.

COMPARATIVE EXAMPLE 2

A photosensitive plate sample was prepared according to the same procedures as in Example 1 except that there was employed the following formulation as a photopolymerizable composition coating liquid.

| | |
|---|---|
| "HP-50" (Trade name of hydroxypropyl-methyl cellulose available from Shin-Etsu Chemical Co., Ltd.) | 10 parts by weight |
| Trimethylolpropane triacrylate | 10 parts by weight |
| Diisopropyl thioxanthone | 2 parts by weight |
| Dimethylaminobenzoic acid isoamyl ester | 1 part by weight |
| Hydroquinone | 0.01 part by weight |
| Methyl Cellosolve | 200 parts by weight |

This sample was exposed and developed in the same manner as in Example 1, whereupon the development took about 90 seconds.

EXAMPLE 2

A metal deposited film was prepared by a vacuum deposition of aluminium onto a polyethylene terephthalate film with a film thickness of 100 μm up to 700 Å of its film thickness. Then, the following photopolymerizable composition coating liquid was coated over the deposited film to 2μ of its film thickness after drying.

A 10% dispersion of Methyl Cellosolve of

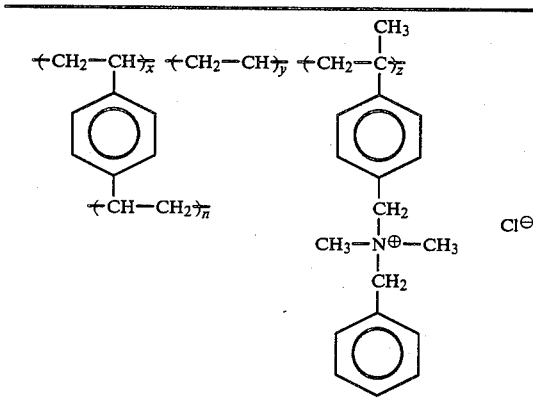

| | |
|---|---|
| (wherein x:y:z = 4:68:28) | 100 parts by weight |
| Pentaerythritol triacrylate | 10 parts by weight |
| Isopropyl thioxanthone | 2 parts by weight |
| Dimethylaminobenzoic acid isoamyl ester | 1 part by weight |
| Hydroquinone | 0.01 part by weight |
| Methyl Cellosolve | 100 parts by weight |

Thereafter, an overcoat liquid having the following formulation was coated thereover to a film thickness of 1.5μ.

| | |
|---|---|
| Polyvinyl alcohol ("Gosenol GL-05", manufactured by the Nippon Synthetic Chemical Industry Co., Ltd.) | 1 part by weight |
| Water | 9 parts by weight |

Then, the coated material was exposed to a 3 KW metal halide lamp through a negative film from a distance of 80 cm for 5 seconds. This sample was dipped into water at 20° C. for 10 seconds, lightly rubbed with a sponge to remove an uncured portion to make exposed the under layer of aluminium. The exposed aluminium was dissolved out with a solution containing 30 ml of phosphoric acid in 100 ml of water, washed with water and then dried to produce a masking film, which had an optical density of not less than 3.0 and a resolving power of not less than 50 lines/mm.

EXAMPLE 3

Over an aluminium plate treated in the same manner as in Example 1 was coted the following photopolymerizable composition coating liquid to a film thickness of 1.5μ after drying.

| | |
|---|---|
| "Primal LC-40" (aqueous emulsion of acrylic resin with a solid content of 50%; manufactured by Rohm & Haas Co., Ltd.) | 20 parts by weight |
| "Aronix M-8060" (manufactured by Toagosei Chemical Industry Co., Ltd.) | 20 parts by weight |
| Methyl thioxanthone | 4 parts by weight |
| Dimethylaminobenzoic acid isoamyl ester | 2 parts by weight |
| Hydroquinone | 0.02 part by weight |
| Methyl Cellosolve | 100 parts by weight |

The above-mentioned photosensitive plate was exposed and developed in the same manner as in Example 1 to produce a strongly cured image with the uncured portion being removed.

EXAMPLE 4

Over a glass-epoxy resin plate having laminated thereover a copper foil with a thickness of 18μ was coated the following photopolymerizable composition coating liquid to a film thickness of about 5μ after drying.

A 10% dispersion of Methyl Cellosolve of $$+CH_2-CH+_x \ +CH_2-CH+_y \ +CH_2-C+_z$$
with CH$_3$ and COOH substituents, and $+CH-CH_2+_n$

| | |
|---|---|
| (wherein x:y:z = 4:86:10) | 100 parts by weight |
| Trimethylolpropane triacrylate | 20 parts by weight |
| Diisopropyl thioxanthone | 4 parts by weight |
| Dimethylaminobenzoic acid isoamyl ester | 4 parts by weight |
| Hydroquinone | 0.02 part by weight |
| Methyl Cellosolve | 70 parts by weight |

A negative copy for a printing base plate was put upon the present sample and exposed to a 3 KW metal halide lamp for 10 seconds from a distance of 80 cm. The sample was dipped into water at 20° C. for 10 seconds and lightly rubbed with a sponge to remove the uncured portion thereof, thereby making exposed the copper underlayer. Then, the sample was dipped into an aqueous solution of cupric chloride for 5 minutes to dissolve out the exposed copper, washed with water and then dried to produce a good print circuit base plate with no defauts.

EXAMPLE 5

Over one side of a polyethylene terephthalate film with a thickness of 100 μm was coated the following coating liquid to a film thickness of about 1.5μ after drying and then dried to form a colored masking layer.

(a) Colored masking layer

| | |
|---|---|
| Hydroxypropylmethylcellulose phthalate (manufactured by Shin-Etsu Chemical Co., Ltd.; "HP-50") | 10 parts by weight |
| Carbon black (manufactured by Mitsubishi Chemical Industries Ltd.; "#50") | 5 parts by weight |
| Methyl Cellosolve | 100 parts by weight |
| Methanol | 100 parts by weight |

Over the colored masking layer were coated the photosensitive solution [A] and the comparative photosensitive solutions [B] and [C] to a film thickness of 1.5 μm, respectively.

(b) Photosensitive solution [A] (according to this invention)

A 10% dispersion of Methyl Cellosolve of

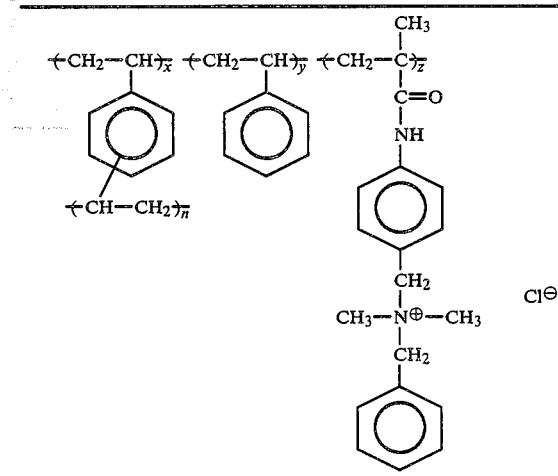

| | |
|---|---|
| (wherein x:y:z = 4:48:48) | 100 parts by weight |
| Trimethylolpropane triacrylate | 10 parts by weight |
| Diisopropylthioxanthone | 2 parts by weight |
| Dimethylaminobenzoic acid isoamyl ester | 1 part by weight |
| Hydroquinone | 0.01 part by weight |
| Methyl Cellosolve | 70 parts by weight |

(c) Photosensitive solution [B] (Comparative Photosensitive Solution)

| | |
|---|---|
| Hydroxypropylmethylcellulose phthalate ("HP-50") | 10 parts by weight |
| Trimethylolpropane triacrylate | 10 parts by weight |
| Diisopropyl thioxanthone | 2 parts by weight |
| Dimethylaminobenzoic acid isoamyl ester | 1 part by weight |
| Hydroquinone | 0.01 part by weight |
| Methyl Cellosolve | 160 parts by weight |

(d) Photosensitive solution [C] (Comparative Photosensitive Solution)

| | |
|---|---|
| Polyvinyl pyrrolidone | 10 parts by weight |
| Trimethylolpropane triacrylate | 10 parts by weight |
| Diisopropyl thioxanthone | 2 parts by weight |
| Dimethylaminobenzoic acid isoamyl ester | 1 part by weight |
| Hydroquinone | 0.01 part by weight |
| Methyl Cellosolve | 160 parts by weight |

Then, the over coating solution having the following formulation was further coated over the above sample to a film thickness of about 2.5 μm to form image-forming material sample (A), (B) and (C), respectively.

| | |
|---|---|
| Polyvinyl alcohol ("Gosenol GL-05", manufactured by the Nippon Synthetic Chemical Industry Co., Ltd.) | 1 part by weight |
| Water | 9 parts by weight |

Each sample of the above-mentioned 3 image-forming materials was exposed to a 3 KW metal halide lamp for 10 seconds from a distance of 80 cm, together with a dot point copy put thereover, and then developed by dipping into water at 20° C. and lightly rubbing. The results are shown in the following Table 1.

TABLE 1

| Image-forming material | Results |
|---|---|
| (A); the present invention | Even details of dot point reproduced well Developing time; about 30 seconds |
| (B); Comparative | Even details of dot point reproduced well Developing time; about 2 minutes |
| (C); Comparative | Many pinholes with less medium dot points being lacked Developing time; about 20 seconds |

As is apparent from the above Table 1, the image-forming material with the present photopolymerizable composition can show very excellent image characteristics and also be developable in a short period of time.

EXAMPLE 6

Over one side of a polyethylene terephthalate film having a thickness of 100μ and a gelatin subbing layer was coated a coating liquid having the following formulation to a film thickness of about 1.5μ after drying and then dried to produce a colored masking layer.

(a) Colored masking layer

| | |
|---|---|
| Gelatin | 1 part by weight |

| | |
|---|---|
| Carbon black | 1 part by weight |
| Water | 8 parts by weight |

Over the colored masking layer was coated the following photosensitive solution to a film thickness of 1.5μ after drying.

A 10% dispersion of Methyl Cellosolve of

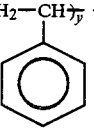

| | |
|---|---|
| (wherein x:y:z = 4:86:10) | 100 parts by weight |
| "Aronix M-8060" | 30 parts by weight |
| Isopropyl thioxanthone | 6 parts by weight |
| Dimethylaminobenzoic acid isoamyl ester | 3 part by weight |
| Hydroquinone | 0.03 part by weight |
| Methyl Cellosolve | 70 parts by weight |

An over-coating layer was further formed thereon to produce the present sample in the same manner as in Example 5.

This present sample was exposed and developed in the same manner as in Example 5 except that an exposure time was 30 seconds to form a sharp black image in a developing time of about 15 seconds.

EXAMPLE 7

The present sample was prepared in the same manner as in Example 5 except that there was employed as a photosensitive layer coating solution the following formulation.

| | |
|---|---|
| "SW-10" (a wax emulsion; manufactured by Nisshin Kasei K.K.; a solid content of 10%) | 100 parts by weight |
| Pentaerythritol triacrylate | 10 parts by weight |
| Isopropyl thioxanthone | 2 parts by weight |
| Dimethylaminobenzoic acid isoamyl ester | 1 part by weight |
| Hydroquinone | 0.01 part by weight |
| Toluene | 70 parts by weight |

The present sample was exposed and developed in the same manner as in Example 5 to form a sharp black image in a developing time of 30 seconds.

We claim:

1. A photopolymerizable composition which comprises an organic solvent-soluble ethylenic unsaturated compound, an organic solvent-dispersible, water-insoluble granular dispersion, said dispersion being a latex high molecular weight compound having a polar group and an organic solvent-soluble photopolymerization initiator, each of said unsaturated compound, said granular dispersion and said initiator being dissolved or dispersed in a solvent composed mainly of an organic solvent.

2. The photopolymerizable composition according to claim 1, wherein said polar group is selected from the group consisting of:

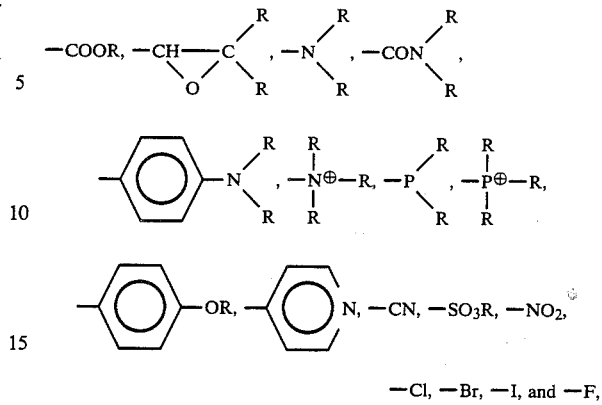

wherein R is a hydrogen atom, an alkyl group or a carbocyclic group.

3. The photopolymerizable composition according to claim 1, wherein said latex high molecular weight compound is a high molecular weight compound having a quaternary nitrogen atom or a quaternary phosphorus atom.

4. The photopolymerizable composition according to claim 1, wherein said organic-soluble ethylenic unsaturated compound is present in an amount of 40 to 70% by weight based on the weight of the total solid content of said composition.

5. The photopolymerizable composition according to claim 1, wherein said organic solvent-soluble ethylenic unsaturated compound is insoluble in water.

6. The photopolymerizable composition according to claim 1, wherein said organic solvent-soluble photopolymerization initiator is insoluble in water.

7. The photopolymerizable composition according to claim 1, wherein said latex high molecular weight compound is internally cross-linked in the form of granules.

8. The photopolymerizable composition according to claim 1, wherein said organic solvent-soluble photopolymerization initiator is a thioxanthone compound.

9. The photopolymerizable composition according to claim 1, wherein said solvent contains water in an amount of less than 50% by weight based on the weight of said solvent.

10. The photopolymerizable composition according to claim 9, wherein the amount of water is less than 10% by weight based on the weight of said solvent.

11. A water-developable image-forming material which comprises a layer formed by coating on a support a photopolymerizable composition comprising an organic solvent soluble ethylenic unsaturated compound, an organic solvent-dispersible, water insoluble granular dispersion, said dispersion being a latex high molecular weight compound having a polar group and an organic solvent-soluble photopolymerization initiator, said unsaturated compound, said granular dispersion and said initiator being dissolved or dispersed in a solvent composed mainly of an organic solvent.

12. The image-forming material according to claim 11, wherein said image-forming material has a colored masking layer on the support.

13. The image-forming material according to claim 12, wherein said colored masking layer contains a water-softening high molecular weight compound.

14. The image-forming material according to claim 12, wherein said color masking layer contains carbon black as a coloring agent.

15. The image-forming material according to claim 11, wherein said polar group is selected from the group consisting of:

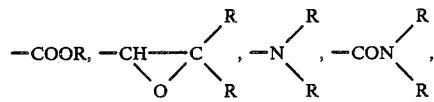

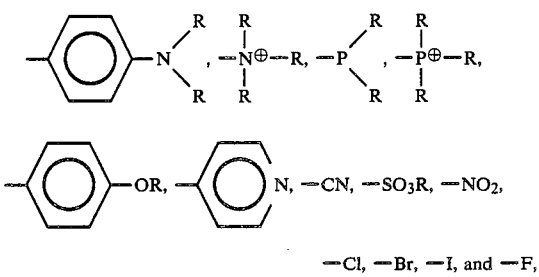

—Cl, —Br, —I, and —F, wherein R is a hydrogen atom, an alkyl group or a carbocyclic group.

16. The image-forming material according to claim 11, wherein said latex high molecular weight compound is a high molecular weight compound having a quaternary nitrogen atom or a quaternary phosphorus atom.

* * * * *